United States Patent
Woon et al.

(10) Patent No.: US 7,838,887 B2
(45) Date of Patent: Nov. 23, 2010

(54) SOURCE/DRAIN CARBON IMPLANT AND RTA ANNEAL, PRE-SIGE DEPOSITION

(75) Inventors: Wei-Yen Woon, Taoyuan (TW); Chun-Feng Nieh, Baoshan Township (TW); Ching-Yi Chen, Hsin-Chu (TW); Hsun Chang, Hsin-Chu (TW); Chung-Ru Yang, Chung-Ho (TW); Li-Te S. Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/112,507

(22) Filed: Apr. 30, 2008

(65) Prior Publication Data

US 2009/0273034 A1    Nov. 5, 2009

(51) Int. Cl.
*H01L 21/00*    (2006.01)

(52) U.S. Cl. .......... 257/74; 257/1; 257/9; 257/E21.223; 257/E21.207

(58) Field of Classification Search .......... 257/E21.223, 257/E21.207, E21.395, E21.584, E21.399, 257/E21.74, 35, 19, 368, E21.232, 297, E21.431, 257/E21.619
See application file for complete search history.

(56) References Cited

U.S. PATENT DOCUMENTS

| 5,514,902 | A | * | 5/1996 | Kawasaki et al. ........... 257/607 |
| 6,214,682 | B1 |  | 4/2001 | Wang |
| 6,251,800 | B1 | * | 6/2001 | Sun et al. .................... 438/763 |
| 6,537,886 | B2 |  | 3/2003 | Lee |
| 7,687,337 | B2 |  | 3/2010 | Zhang et al. |
| 2006/0068555 | A1 | * | 3/2006 | Zhu et al. ................... 438/303 |
| 2008/0023732 | A1 |  | 1/2008 | Felch et al. |
| 2008/0057683 | A1 |  | 3/2008 | Pawlak |

\* cited by examiner

*Primary Examiner*—Davienne Monbleau
*Assistant Examiner*—Shweta Mulcare
(74) *Attorney, Agent, or Firm*—Slater & Matsil, L.L.P.

(57) ABSTRACT

A semiconductor device system, structure, and method of manufacture of a source/drain to retard dopant out-diffusion from a stressor are disclosed. An illustrative embodiment comprises a semiconductor substrate, device, and method to retard sidewall dopant out-diffusion in source/drain regions. A semiconductor substrate is provided with a gate structure, and a source and drain on opposing sides of the gate structure. Recessed regions are etched in a portion of the source and drain. Doped stressors are embedded into the recessed regions. A barrier dopant is incorporated into a remaining portion of the source and drain.

10 Claims, 15 Drawing Sheets

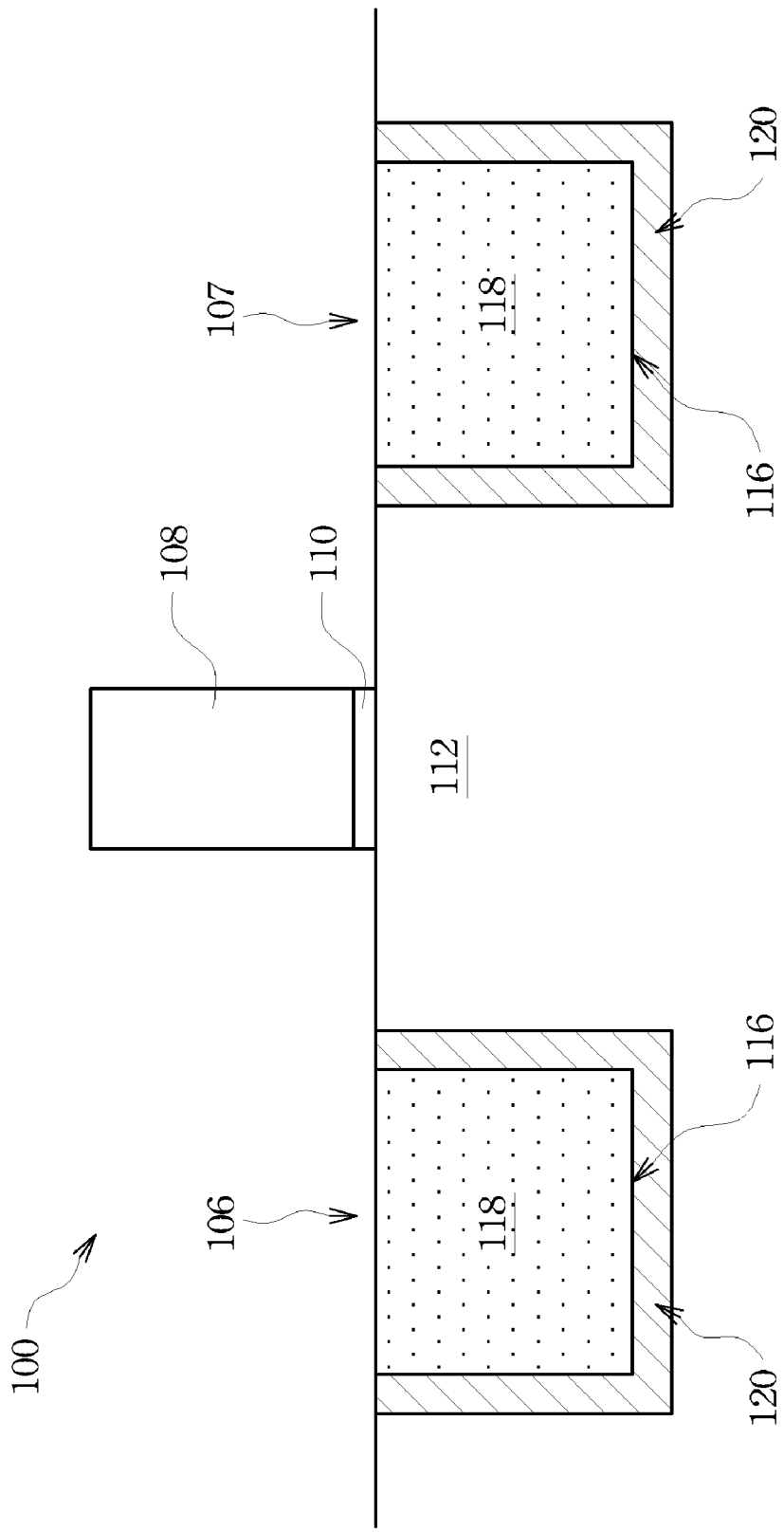

SOURCE/DRAIN CARBON IMPLANT AND RTA ANNEAL, PRE-SIGE DEPOSITION

TECHNICAL FIELD

The present invention relates generally to a semiconductor device, system, and method of manufacture, and more particularly to a semiconductor device, system, and method to retard dopant out-diffusion in transistor source/drain regions.

BACKGROUND

Size reduction of metal-oxide-semiconductor field-effect transistors (MOSFET) has enabled the continued improvement in speed, performance, density, and cost per unit function of integrated circuits. One way to improve transistor performance is through selective application of stress to the transistor channel region. Stress distorts (i.e., strains) the semiconductor crystal lattice, and the distortion, in turn, affects the band alignment and charge transport properties of the semiconductor. By controlling the magnitude and distribution of stress in a finished device, manufacturers can increase carrier mobility and improve device performance.

One approach of introducing stress in the transistor channel region includes growing an epitaxial layer of SiGe within recesses in the source/drain regions. In this case, lattice mismatch creates a uni-axial compressive stress within the channel region. One problem facing complementary metal-oxide-semiconductor (CMOS) manufacturing is that N-channel metal-oxide-semiconductor (NMOS) and P-channel metal-oxide-semiconductor (PMOS) devices require different types of stress in order to achieve increased carrier mobility. PMOS fabrication methods may include using substrate structures that apply a compression stress to the channel. Therefore, CMOS manufacturing techniques may address PMOS and NMOS devices separately.

High germanium concentration in epitaxial silicon germanium (e-SiGe) may be needed to boost channel compressive strain in PMOS devices. Boron doping may be incorporated into the e-SiGe for lower sheet resistance and contact resistance in the source drain regions. However, because of the high concentration of boron in the e-SiGe, the boron may tend to out-diffuse into the channel region. Boron out-diffusion in a PMOS may result in a voltage threshold ($v_{th}$) reduction in short channel transistors. This roll-off in $v_{th}$ is termed the short channel effect (SCE).

To counteract the effects of the boron out-diffusion, one known method includes a series of implants (termed pocket or halo implants) following the etching of source/drain recess regions and dummy sidewall regions of the gate electrode. The pocket implants may have a phosphorous dose of about $4.0\,E13\,cm^{-2}$ or greater and an arsenic dose of $3.0\,E13\,cm^{-2}$ or greater. One disadvantage to the known method is that the pocket implant dose may be high enough to cause damage to the sidewalls and bottom of the recessed source/drain regions, in which the stressor material layer or layers are deposited. A further disadvantage to the known methods and structures is that boron out-diffusion is not adequately controlled, resulting in short channel effects.

SUMMARY OF THE INVENTION

These and other problems are generally solved or circumvented, and technical advantages are generally achieved by providing a semiconductor device, system, and method to retard sidewall boron out-diffusion in PMOS source/drain regions. A semiconductor substrate is provided with a gate structure and a source and drain on opposing sides of the gate structure. Recessed regions are etched in a portion of the source and drain. Doped stressors are embedded into the recessed regions. A barrier dopant is incorporated into a remaining portion of the source and drain.

Advantages of preferred embodiments of the present invention may include providing an improved short channel effect demonstrated by a thirty percent lower drain induced barrier lowering (DIBL). A further advantage of an illustrative embodiment of the present invention is reduced gate edge damage from a reduced pocket implant. Yet another advantage of an illustrative embodiment of the present invention is a lower e-SiGe resistance.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which:

FIG. 1 depicts a cross-sectional view of selected features of an illustrative embodiment;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 2A:
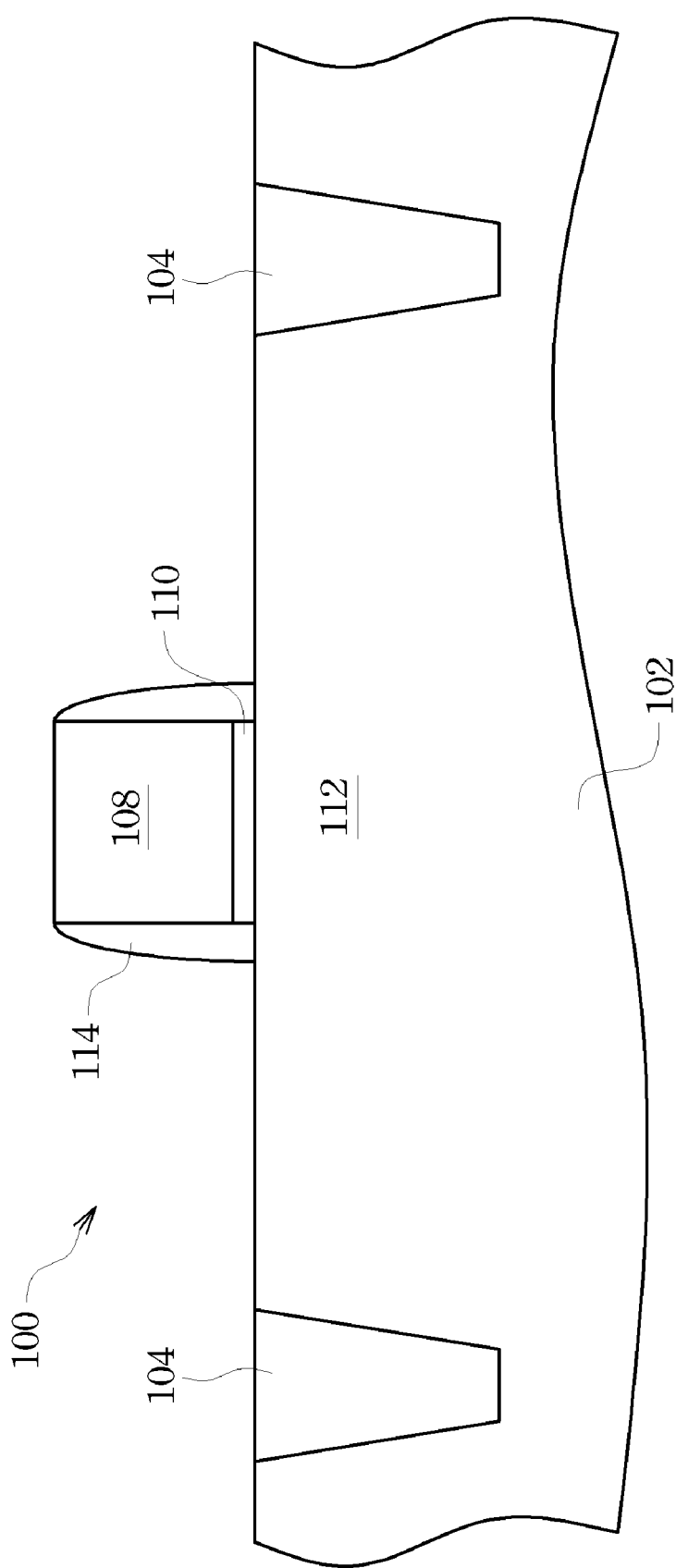
FIGS. 2A-2D show cross-sectional views of selected process steps illustrating a first embodiment of a PMOS structure that retards the out-diffusion of boron.

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely boron doped, epitaxially grown, SiGe embedded source/drain PMOS transistor. The invention may also be applied, however, to other semiconductor devices including other stressor materials, for example Si doped with Sb and the like. Further, the example barrier dopant in the embodiment illustrated is carbon; other barrier dopants are within the scope of the invention including but not limited to fluorine, nitrogen and the like.

FIG. 1 depicts a cross-sectional view of selected features of an illustrative embodiment. Transistor 100 is shown with gate electrode 108 and gate dielectric 110. On opposing sides of the gate structure 108/110 are source 106 and drain 107. Source/drain 106/107 are comprised of two portions: recessed portion 116 and remaining portion 120. Recessed portion 116 is embedded with boron doped stressor 118. Boron doped stressor 118 may be epitaxial SiGe for example. Remaining portion 120 of source/drain 106/107 has carbon and nitrogen incorporated into a substrate material. The carbon in remaining portion 120 may retard the out-diffusion of the boron from doped stressor 118 into channel region 112. An advantage of an illustrative embodiment is that as the channel length decreases, the effects of $V_{th}$ roll-off will be less severe (See FIG. 9). Further, nitrogen in remaining portion 120 is incorporated during an anneal process which repairs damage and passivates the interface between recessed portion 116 and remaining portion 120 of source/drain 106/107. Further, implanting a lower dose of a phosphorous dopant during pocket implant (not shown) may have the additional advantage of lowering damage caused by the implant process.

With reference now to FIGS. 2A-2D, shown are cross-sectional views of selected process steps illustrating a first embodiment of a system that retards out-diffusion of boron. More particularly, FIG. 2A illustrates transistor 100 (such as transistor 100 in FIG. 1) including substrate 102 and shallow trench isolation (STI) region 104. Substrate 102 may comprise bulk silicon, doped or undoped, or an active layer of a silicon on insulator (SOI) substrate. Generally, an SOI substrate comprises a layer of silicon, formed on an insulator layer. The insulator layer may be, for example, a buried oxide layer or a silicon oxide layer. The insulator layer is provided on a substrate, typically silicon or glass substrate. Other substrates that may be used include multi-layered substrates, gradient substrates, or hybrid orientation substrates.

Shallow trench isolation (STI) structures 104 are shown on both sides of transistor 100. Substrate 102 further includes a gate electrode 108 and a gate dielectric 110. Underlying the gate electrode 108 and the gate dielectric 110 is carrier channel region 112. Carrier channel region 112 will provide a connecting path for carriers between the subsequent source and drain regions (not shown).

In alternative embodiments, the channel/substrate orientation may be selected with a view towards optimizing the appropriate charge carrier mobility using SOI or SGOI hybrid orientation substrates. For example, a PMOS channel 112 may be oriented along the <110> direction, which is the direction where hole mobility is maximum for a {110} substrate.

The gate dielectric 110 may include silicon oxide having a thickness from about 6 to 100 Å, and more preferably less than about 20 Å. In other embodiments, the gate dielectric 110 may include a high-k dielectric having a k-value greater than about 4. Possible high-k dielectrics include $Ta_2O_5$, $TiO_2$, $Al_2O_3$, $ZrO_2$, $HfO_2$, $Y_2O_3$, $L_2O_3$, and their Other suitable high-k gate dielectrics may include hafnium-based materials such as $HfO_2$, $HfSiO_x$, and $HfAlO_x$. In a preferred embodiment in which the gate dielectric 110 comprises an oxide layer, the gate dielectric 110 may be formed by an oxidation process, such as wet or dry thermal oxidation in an ambient comprising an oxide, $H_2O$, NO, or a combination thereof, or by chemical vapor deposition (CVD) techniques using tetra-ethylorthosilicate (TEOS) and oxygen as a precursor.

The gate electrode 108 preferably comprises a conductive material such as Ta, Ti, Mo, W, Pt, Al, Hf, Ru, and silicides or nitrides thereof, doped poly-silicon, other conductive materials, or a combination thereof. In one example, amorphous silicon is deposited and recrystallized to create poly-crystalline silicon (poly-silicon). In the preferred embodiment in which the gate electrode is poly-silicon, gate electrode 108 may be formed by depositing doped or undoped poly-silicon by low-pressure chemical vapor deposition (LPCVD) to a thickness in the range of about 400 Å to about 2500 Å, but more preferably about 1500 Å.

Gate dielectric 110 and gate electrode 108 may be patterned by photolithography techniques known in the art. Generally, photolithography involves depositing a photoresist material, which is then masked, exposed, and developed. After the photoresist mask is patterned, an etching process may be performed to remove unwanted portions of the gate dielectric material and the gate electrode material to form gate dielectric 110 and gate electrode 108 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Dummy sidewall spacers 114 may be formed on opposite sides of the gate electrode 108 and gate dielectric 110. Dummy sidewall spacers 114 may comprise silicon nitride ($Si_3N_4$), or a nitrogen containing layer other than $Si_3N_4$, such as $Si_xN_y$, silicon oxynitride $SiO_xN_y$, silicon oxime $SiO_xN_yH_z$, or a combination thereof. The dummy sidewall spacers 114 may be formed from a layer comprising $Si_3N_4$ that has been formed using chemical vapor deposition (CVD) techniques using silane and ammonia as precursor gases.

The sidewall spacers 114 may be patterned by performing an isotropic or anisotropic etch process. Because the thickness of the layer of $Si_3N_4$ is greater in the regions adjacent to the gate electrode 108, an anisotropic etch removes the $Si_3N_4$ material on top of the gate electrode 108 and the areas of substrate 102 not immediately adjacent to the gate electrode 108, leaving the spacer 114 as illustrated in FIG. 1. In an embodiment, the sidewall spacers 114 are from about 1 nm to about 100 nm in width.

Figure 2B:
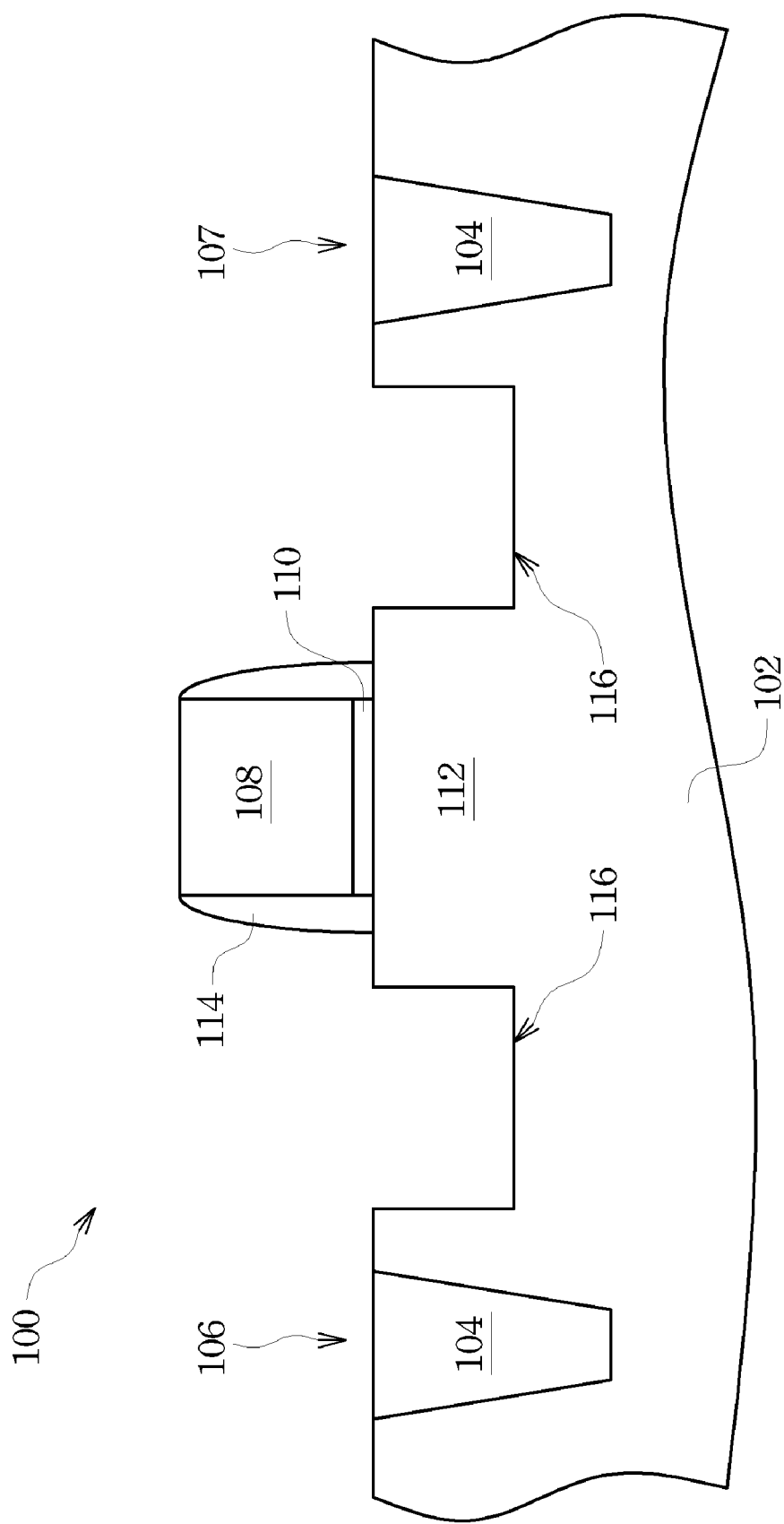

Recessed regions 116 are formed by an etching process that creates recessed regions 116 in the source/drain regions 106/107 on either side of the gate electrode 108 as shown in FIG. 2B. Recessed regions 116 may be formed by a plasma etch using fluorine, chlorine, or bromine chemistry. Alternatively, the recessed regions 116 may be wet etched or dry etched using alternative chemistries. The recessed regions 116 may have a depth between about 10 nm and 200 nm and preferably between about 40 nm and 140 nm. The resultant structure is illustrated in FIG. 2B.

In a first illustrative embodiment, dummy sidewalls 114 are etched before a subsequent carbon implant. Dummy sidewalls are useful in defining the edge of the recessed region 116 and in protecting the gate structure 108/110 during recessed region 116 etching processes. Because a conventional source/drain implant uses the gate electrode 108 and gate electrode spacers 114 as an implant mask, further source/drain implants may be performed after forming the electrode spacers. Dummy sidewalls 114 may be etched by a dry or wet etch such as an isotropic etch process using a solution of phosphoric acid ($H_3PO_4$), or the like.

Figure 2C:
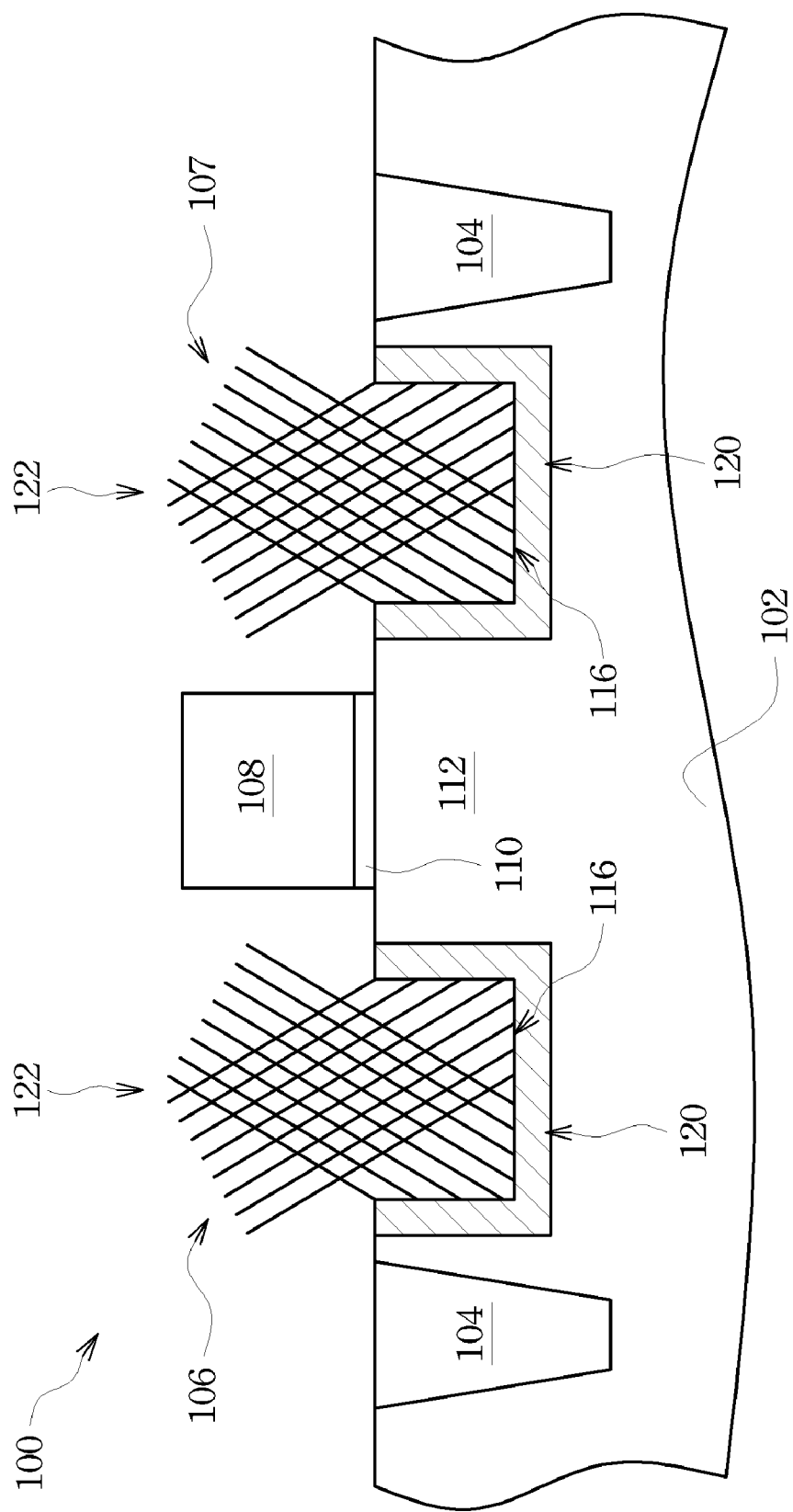

FIG. 2C illustrates transistor 100 after dummy sidewall etch. A tilted carbon implant or implants 122 are implemented, for example, incorporating carbon into remaining portions 120 of source/drain regions 106/107. Other example barrier dopant implants are fluorine, nitrogen, and the like. The carbon impacts the sidewalls of the recessed regions 116, providing a barrier around recessed region 116 which may retard the out-diffusion into channel region 112 of subsequent boron doping. The implant recipe may provide for an implant dose between about 5.0 E13 and 1.5 E14 ions/$cm^2$, for example, and an implant energy of between about 1.0 and 2.0 KeV, for example. The implant tilt may be between about 25° and 35°, preferably about 30° from normal of the top surface of substrate 102. The implant angle may be used to avoid implanting the carbon into the channel region, where the addition of carbon may cause a reduction in channel mobility. The wafer may be rotated for all or part of the implant.

A rapid thermal anneal (RTA) process may then follow. The RTA may repair implant damage from the carbon implant on the bottom and sidewalls of recessed region 116. Further RTA may incorporate nitrogen into the remaining portion 120 of source/drain 106/107. The nitrogen may be incorporated into the silicon during a reaction with surface oxide. The nitrogen may diffuse through the oxide and into the silicon under the high thermal energy supplied by a high-pressure nitrogen ambient in the RTA process. The RTA process may be performed at between about 850 and 1000° C., preferably 950° C. with a nitrogen ambient.

In one example, the nitrogen concentration may be greater than 5 E18 atoms/$cm^{-3}$.

In one embodiment, a pocket implant is then implemented. The pocket implant is an implant process which may be comprised of a series of implant recipes, performed without leaving the vacuum environment of the implant equipment, or may be performed in separate implant steps. The pocket implant recipes may be phosphorous dopant for example at about 10-40 KeV, 1.0-3.0 E13 $cm^{-2}$, Arsenic dopant at about 20-45 KeV, 2-4 E13 $cm^{-2}$, and boron di-fluoride dopant at about 2-4 KeV 4-7 E14, however the doses may vary within 30% of the example energy and dose. One advantage of an illustrative embodiment is that a lower phosphorous implant dose (recall that the phosphorous pocket implant dose of a known process is 4 E13 $cm^{-2}$) may cause less damage to recessed region 116. Less damage in this region may improve parametric and device yields.

Figure 2D:
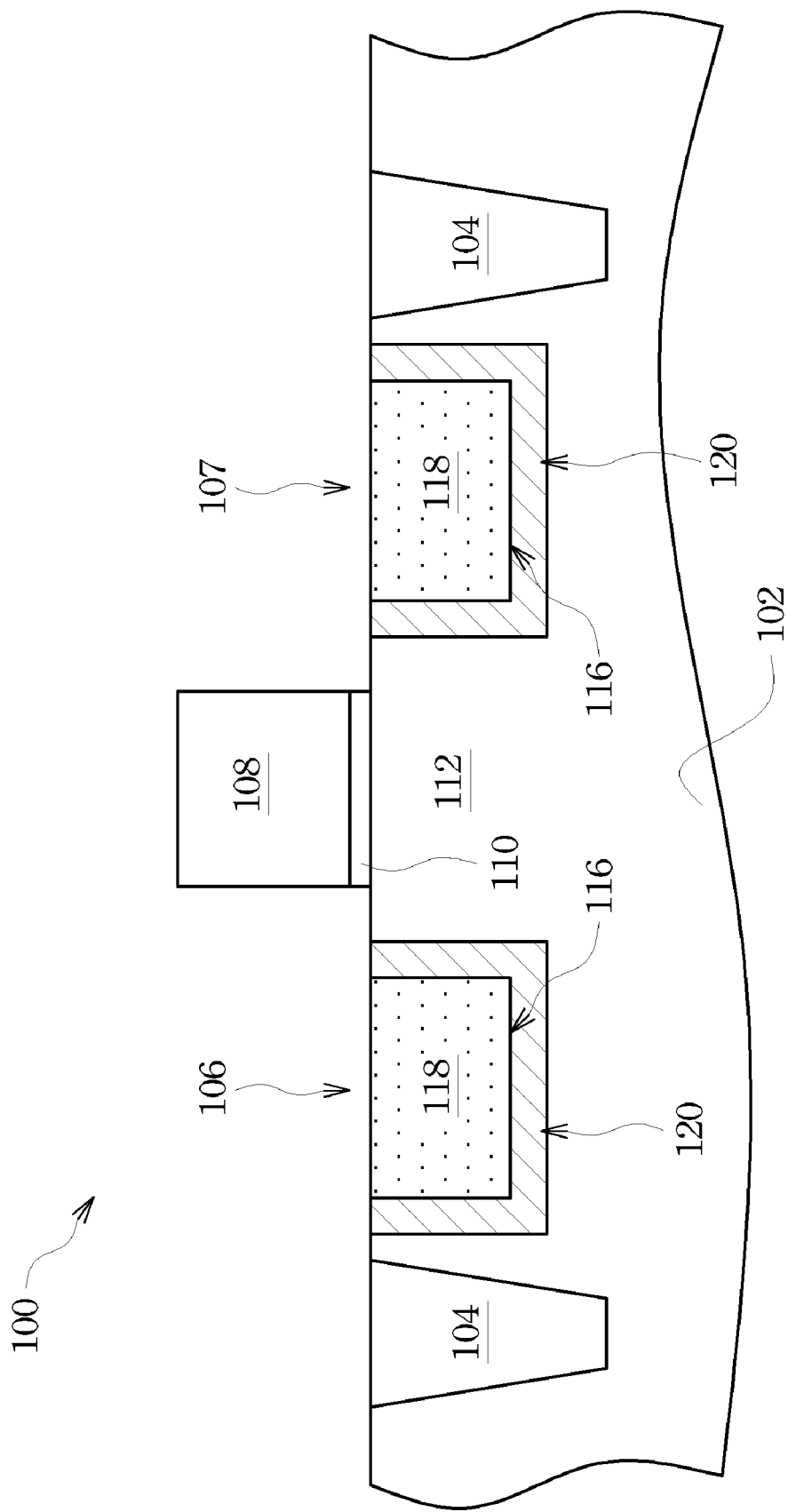

As shown in FIG. 2D, the boron doped e-SiGe embedded stressor 118 is disposed into recessed region 116. Epitaxial growth of the SiGe is preferable; however, other forms of disposing SiGe into the recessed regions may be used. The epitaxial process used to deposit the embedded stressor 118 in source/drain 106/107 regions may include chemical vapor deposition, ultra-high vacuum chemical vapor deposition (UHV-CVD), or molecular beam epitaxy. In alternative embodiments, the SiGe embedded stressor 118 in the source/drain regions 106/107 may have a capping layer or layers (not shown). In further embodiments, the capping layer and the substrate 102 may comprise the same material and therefore have the same lattice spacing. The selective epitaxy may include using silane or dichlorosilane and an etching gas, such as HCl. The selective epitaxy process may be carried out at less than about 900° C., and preferably between about 600 and 800° C. While an illustrative embodiment has an example of SiGe:B as a stressor, other materials are within the scope of the embodiments such as for example Si:Sb, for PMOS and Si:C for NMOS, and the like.

Methods other than epitaxial growth of embedded stressor may be implemented in accordance with an illustrative embodiment. Further, boron doping of the SiGe may be accomplished by doping the epitaxial SiGe in-situ as the SiGe is grown in embedded stressor 118. Boron or other doping may also be accomplished by implant methods.

FIGS. 3A-3D depict selected cross-sections of a second illustrative embodiment. The same reference numbers are designated for the various elements as were used in FIGS. 1 and 2A through 2D. To avoid repetition, each reference number shown the diagram is not described in detail herein. The second embodiment process begins much as the first embodiment process, thus FIG. 3A appears the same as FIG. 2A. However, a SiN etch is implemented in the areas defined as source/drain 106/107.

Figure 3A:
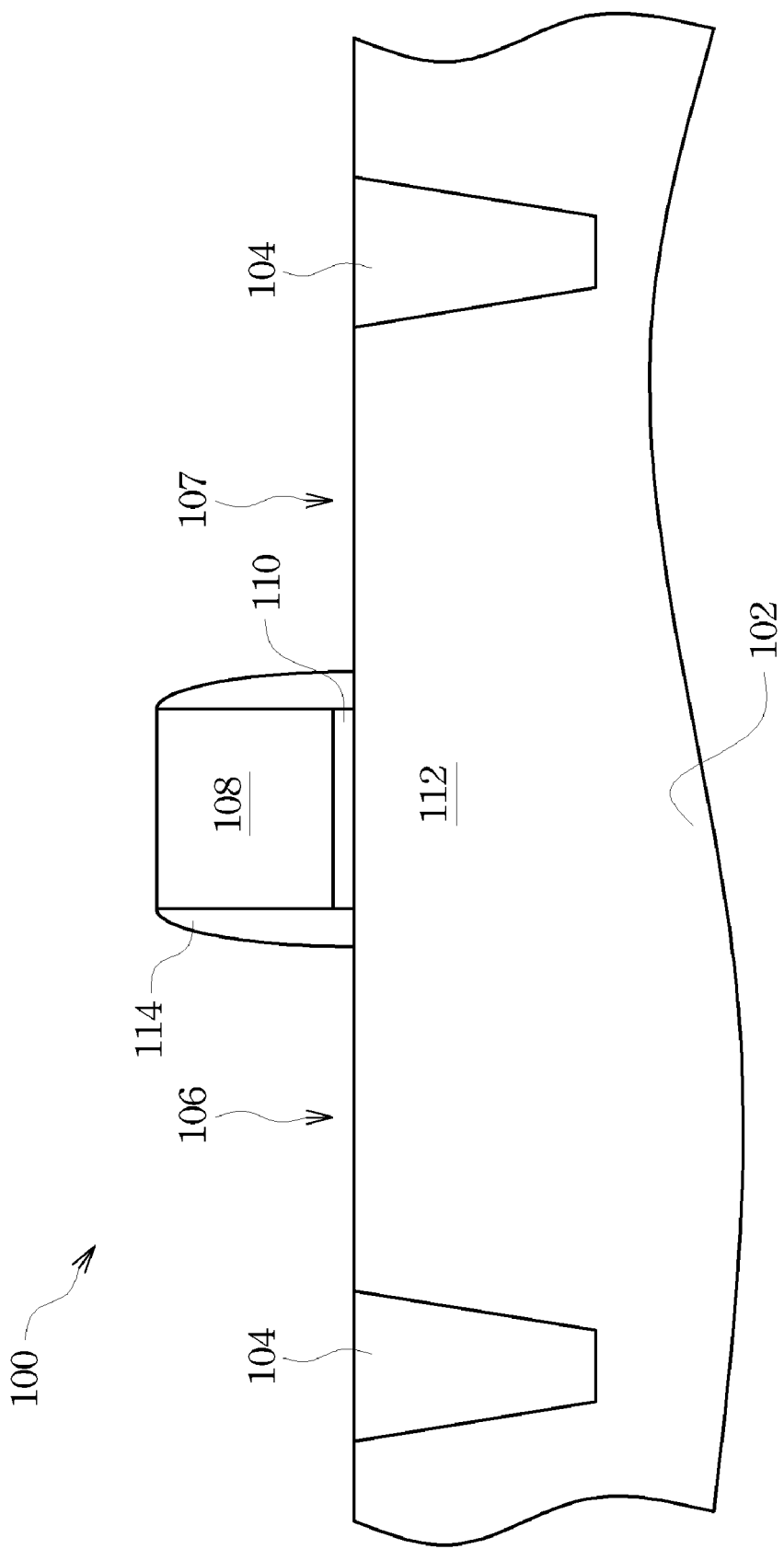
FIGS. 3A-3D show cross-sectional views of selected process steps illustrating a first embodiment of a PMOS structure that retards the out-diffusion of boron.
Figure 3B:
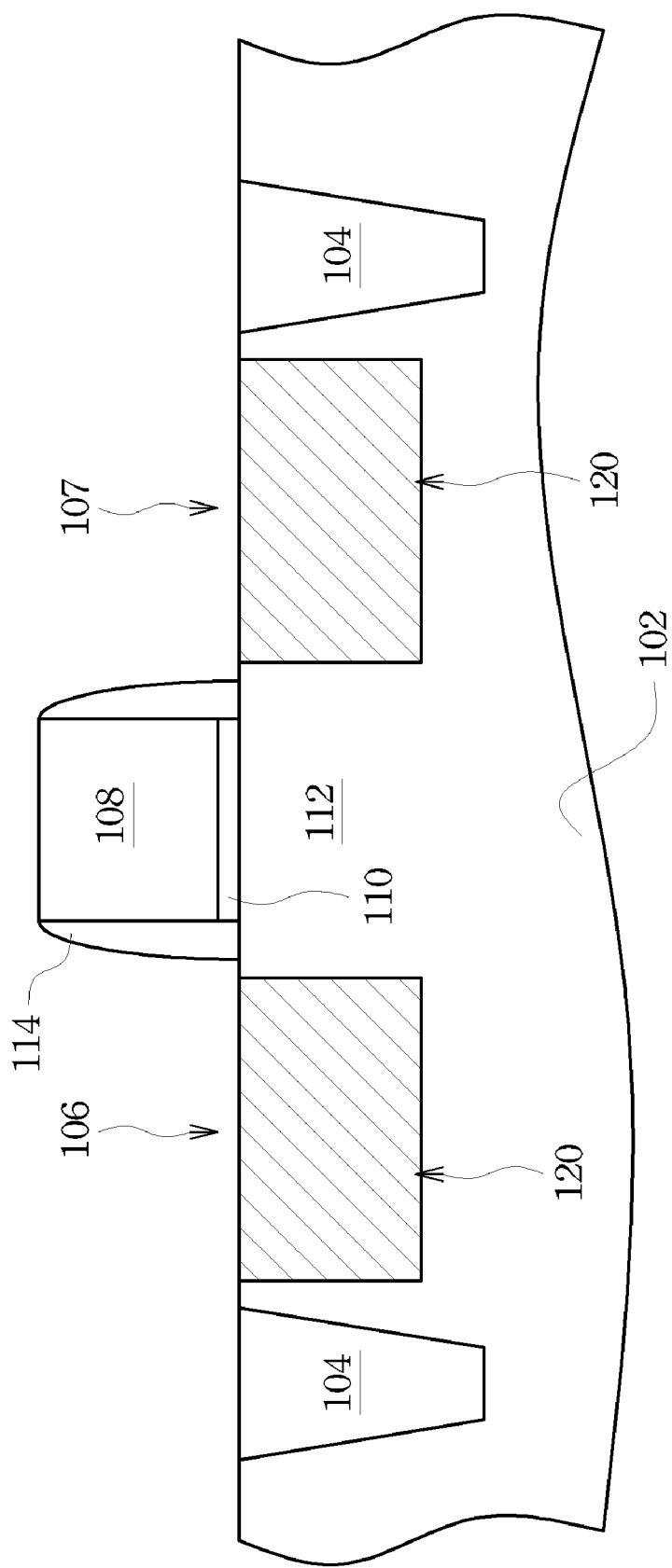

Turning to FIG. 3B, carbon is implanted into source/drain regions 106/107. The implant recipe may provide for an implant dose between about 9.0 E13 and 1.1 E14 ions/$cm^2$, preferably about 1.0 E14 ions/$cm^2$, and an implant energy of between about 6 and 10 KeV, preferably about 8.0 KeV. The implant tilt may be between about 25 and 35°, preferably about 30° from normal of the top surface of substrate 102. Note that the carbon is implanted in the remaining portion 120 in the second embodiment before the recessed regions 116 are formed. Further note that the carbon implant recipe has a higher energy than that of the first embodiment, therefore the carbon may be implanted to a depth that impedes boron out-diffusion from the subsequent boron doped embedded stressor.

Figure 3C:
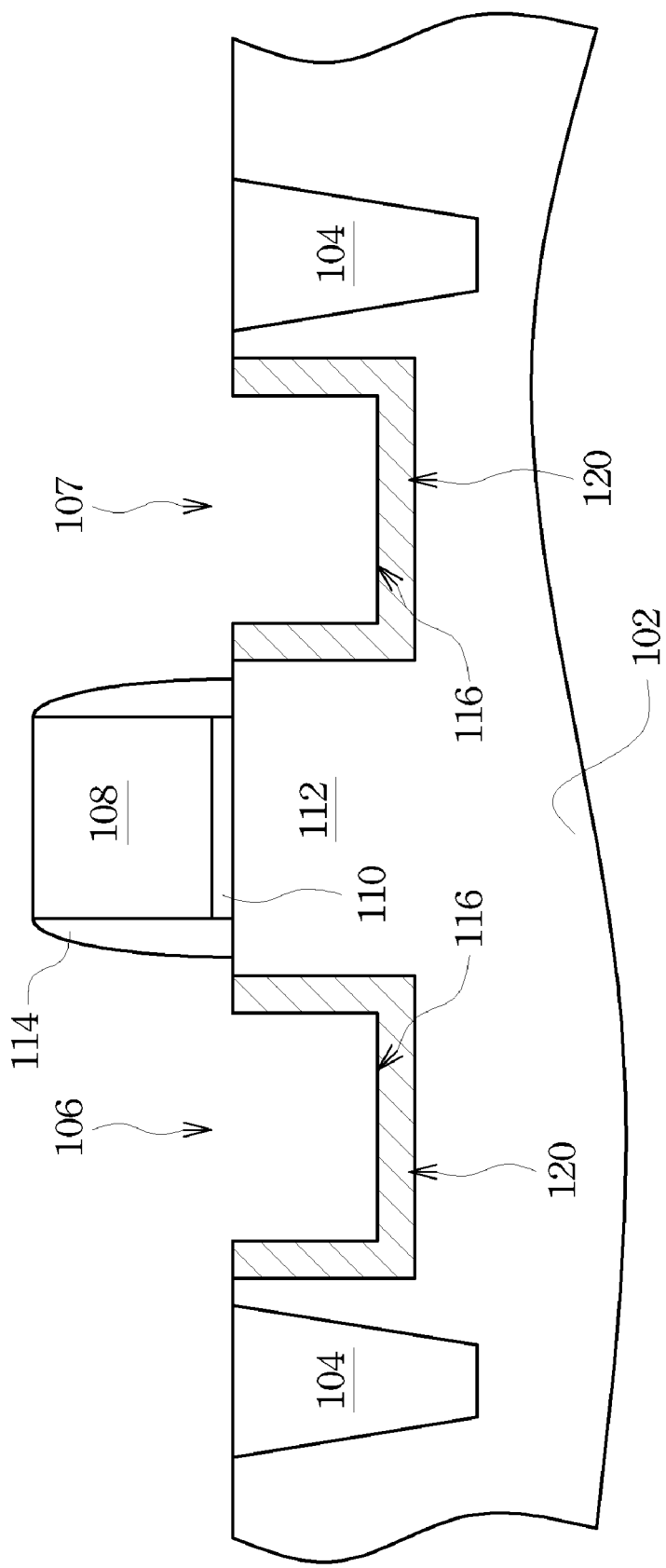

Turning to FIG. 3C, transistor 100 is shown with recessed regions 116 etched in source/drain 106/107. The etch of recessed regions 116 may essentially be done as described in FIG. 2. Following the formation of recessed regions 116, an RTA is implemented, again similar to the RTA process described in FIG. 2 above. During the RTA process, nitrogen is incorporated into remaining portion 120.

Figure 3D:
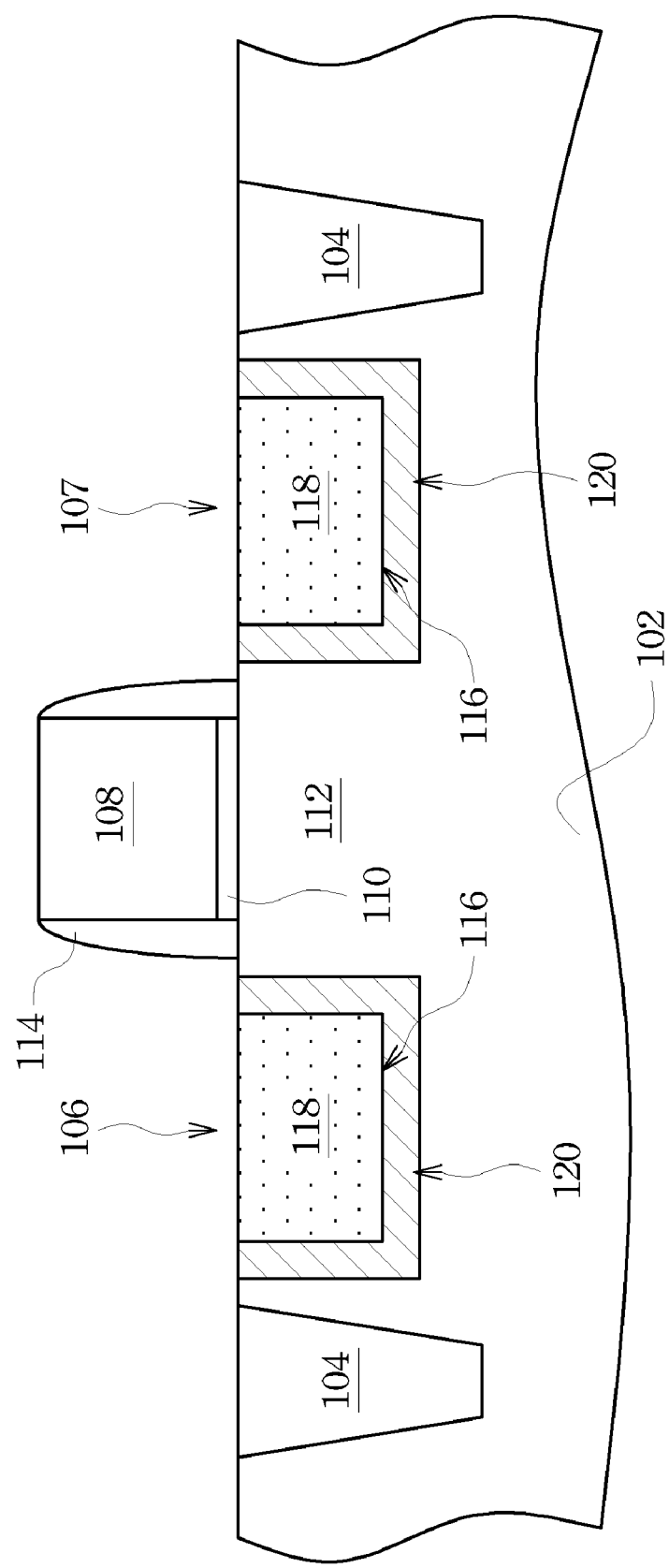

A pocket implant may then be implemented. The implant may comprise an implant similar to that discussed in FIG. 2 above. An optional post pocket implant anneal may be implemented. As shown in FIG. 3D, the boron doped e-SiGe is then grown in the recessed regions, forming the embedded stressors 118 in source/drain regions 106/107 such as described in FIG. 2 above.

Figure 4:
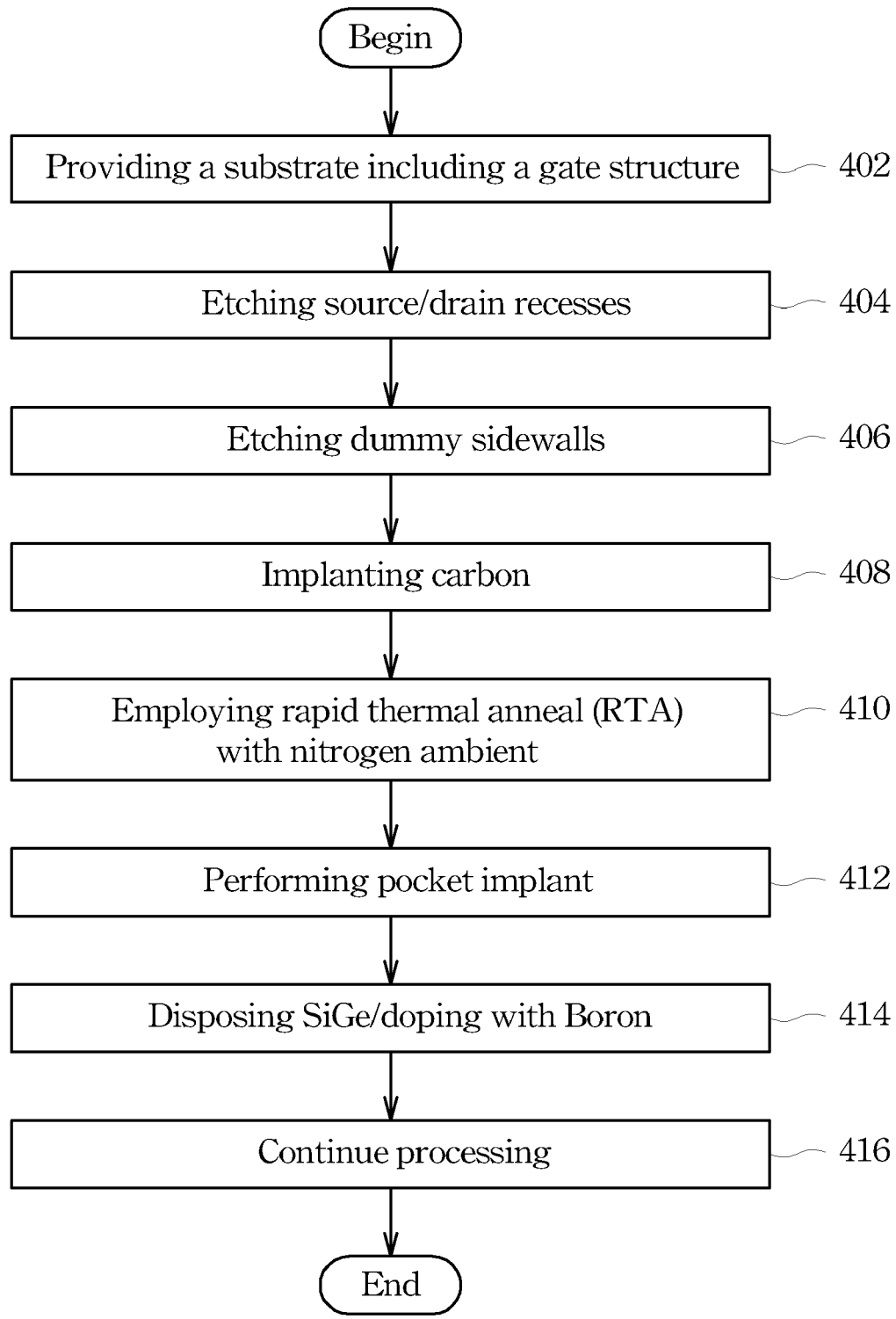
FIG. 4 shows a process flow according to a first illustrative embodiment.

FIG. 4 shows a method of process steps according to a first illustrative embodiment. The process begins by providing a substrate including a gate structure (step 402). The gate structure may comprise a conductive gate electrode and a gate dielectric. The gate structure further comprises dummy sidewalls. Dummy sidewalls are formed on the sides of the gate structure as spacers. The dummy sidewalls aid in defining the edge of the recessed regions.

Recessed regions are etched into a portion of a source/drain (step 404). The dummy sidewalls are removed from the gate structure (step 406). Removing the dummy sidewalls before implant may allow a better coverage of the barrier dopant, in this example carbon, during the tilted carbon implant.

Carbon is implanted into the remaining region of the source/drain (step 408), forming essentially a carbon lining of the recessed regions. In an alternate embodiment, the carbon is more dispersed in the source and drain (See FIG. 5). The carbon implant is tilted to enable carbon to be implanted on the sidewalls as well as the bottom of the recessed regions.

The method provides for a rapid thermal anneal of the substrate in a nitrogen ambient (step 410). The nitrogen from this process is incorporated into the remaining region of the source/drain. The nitrogen may act as passivation in the interface between the remaining portion of the source/drain and the subsequent embedded stressor.

A pocket implant is performed (step 412). The pocket implant may be a three-step implant including a phosphorous dopant, an arsenic dopant, and a boron difluoride dopant. The stressor is then embedded in the recessed regions of the source/drain (step 414). The stressor is preferably an epitaxial in-situ boron doped SiGe structure. An example of the method is illustrated in FIG. 2.

After embedding the stressor, additional processes may be implemented, which may include further high current implant dopants in the source/drain regions (step 416).

Figure 5:
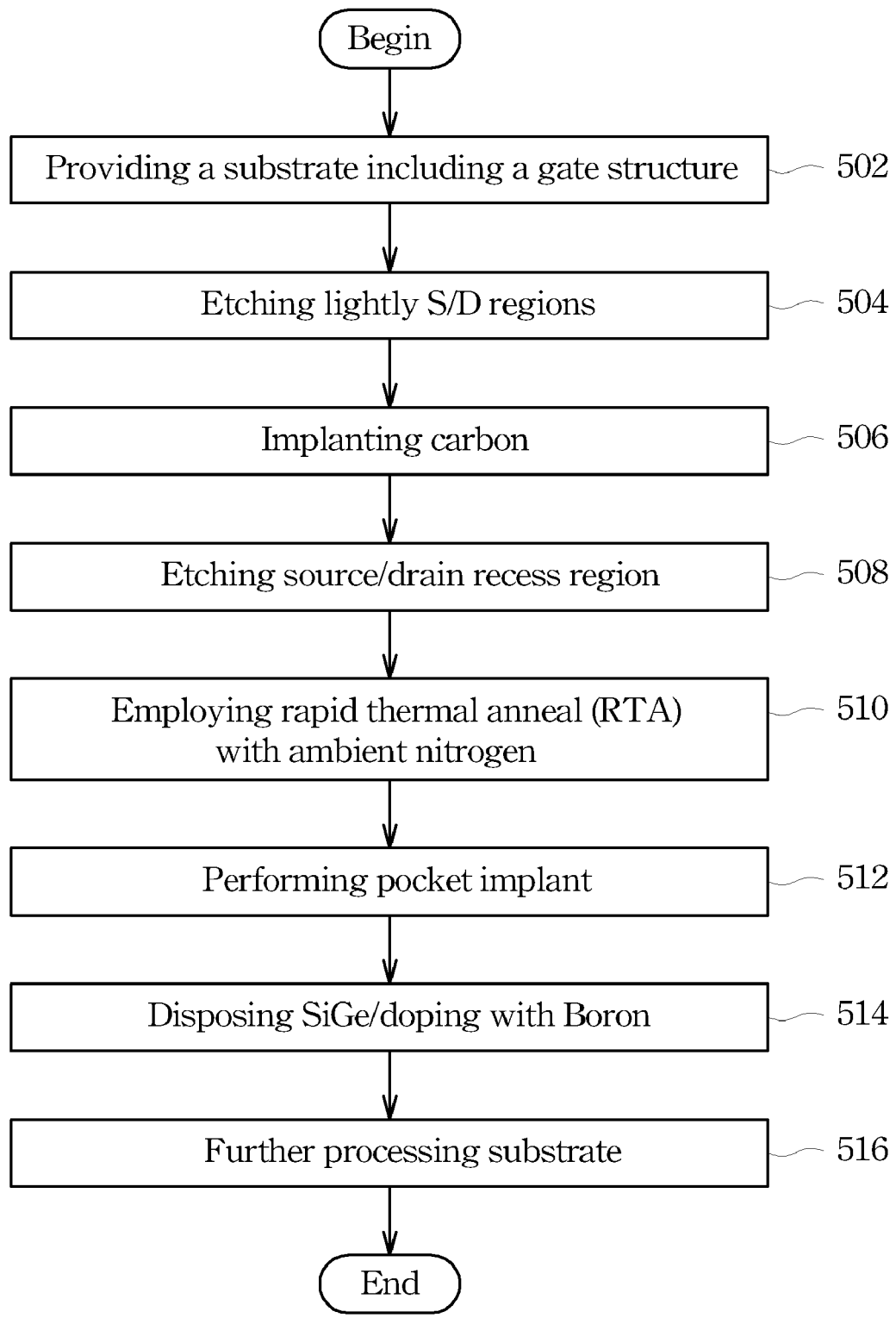
FIG. 5 shows a process flow according to a second illustrative embodiment.

A second embodiment of a method to retard the out-diffusion of a dopant, in this example boron, from a stressor, in this example a Si—Ge stressor, is shown in FIG. 5. The process begins by providing a substrate including a gate structure (step 502). The gate structure has sidewalls such as found in FIG. 3A. The substrate is slightly etched to remove the SiN layer from over the source/drain (step 504). A barrier dopant, in this example carbon, is implanted into the source/drain (step 506). In the second embodiment, the dummy sidewalls are not removed before the carbon implant. Also note, carbon is implanted into the source/drain before etching the recessed regions. The recessed regions of the source/drain are etched (step 508). The substrate is annealed in a nitrogen ambient (step 510). The pocket implants of phosphorous, arsenic, and boron difluoride are performed (step 512). An optional anneal may be performed. The e-SiGe boron doped embedded stressor is grown (step 514). Other types of stressors such as Si, SiC, and the like may alternatively or additionally be deposited. The stressor may be multilayer or monolayer as described. The substrate may be further processed (step 516).

Figure 6:
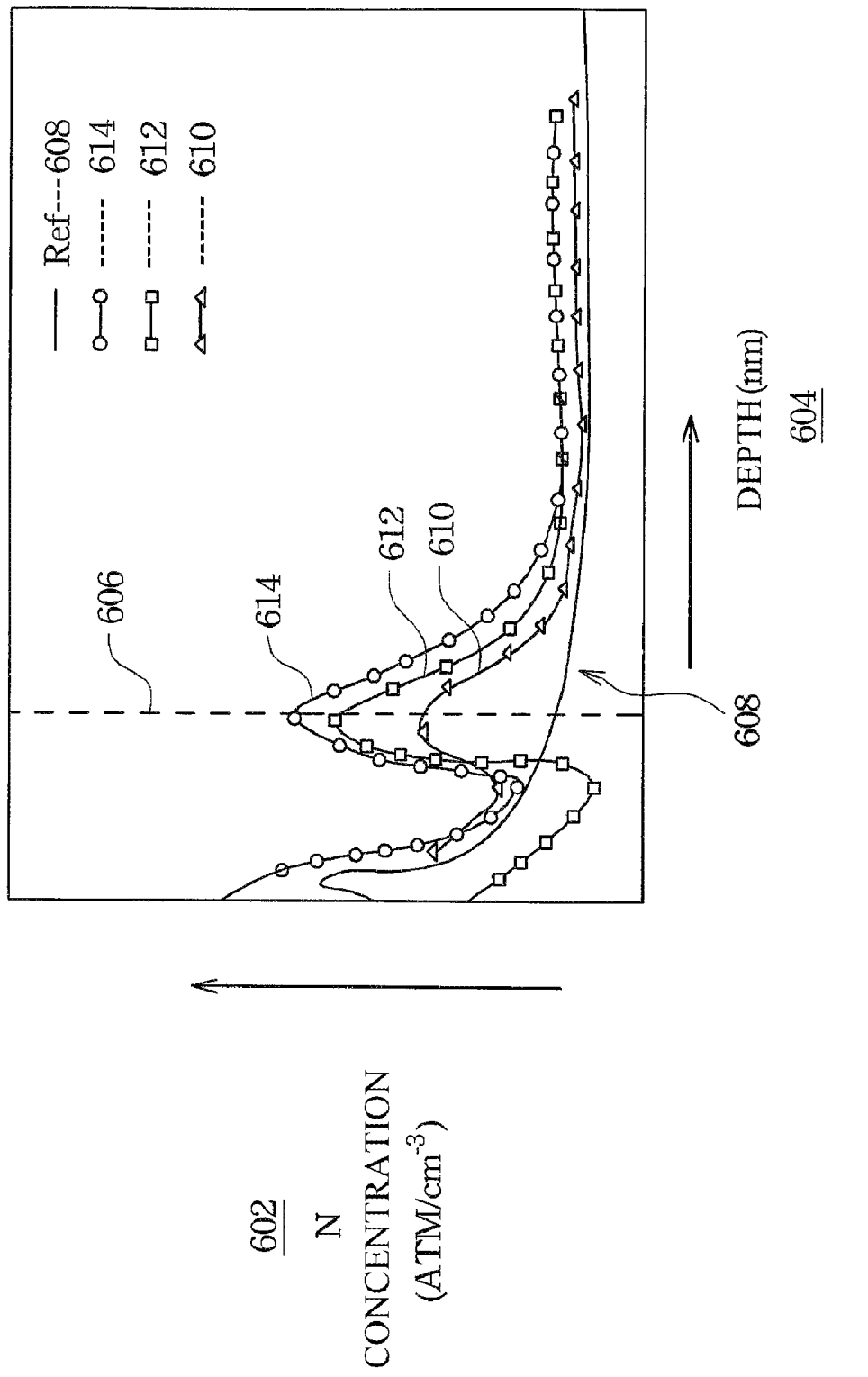
FIG. 6 is a graph of nitrogen concentration by depth in the source/drain region of a transistor, according to an illustrated embodiment.

FIG. 6 is a graph of nitrogen concentration by depth in the source/drain region of a transistor. The y-axis 602 indicates the nitrogen concentration in atoms/cm$^{-3}$. The x-axis 604 indicates the depth of the sample in nanometers (nm). The vertical dashed line 606 indicates the bottom depth of the SiGe/Si interface. The solid curve 608 depicts the nitrogen concentration by depth of the reference (prior art process). The open triangle curve 610 depicts the first embodiment process with the post carbon implant RTA at a temperature $T_1$, the open square curve 612 is the first embodiment process with the post carbon implant RTA at a temperature $T_2$, the open circle curve 614 depicts the first embodiment process with the post carbon implant RTA at a temperature $T_3$, wherein $T_3 > T_2 > T_1$. As can be seen from the graph, the reference sample 608 has the lowest concentration of nitrogen at the SiGe/Si interface. The first embodiment samples 610, 612, and 614 show increasing nitrogen concentration 602 at the SiGe/Si interface as the RTA temperature increases. The RTA is preferably done in a short, for example a 10-second process, so that the thermal budget of the substrate is not exceeded.

Figure 7:
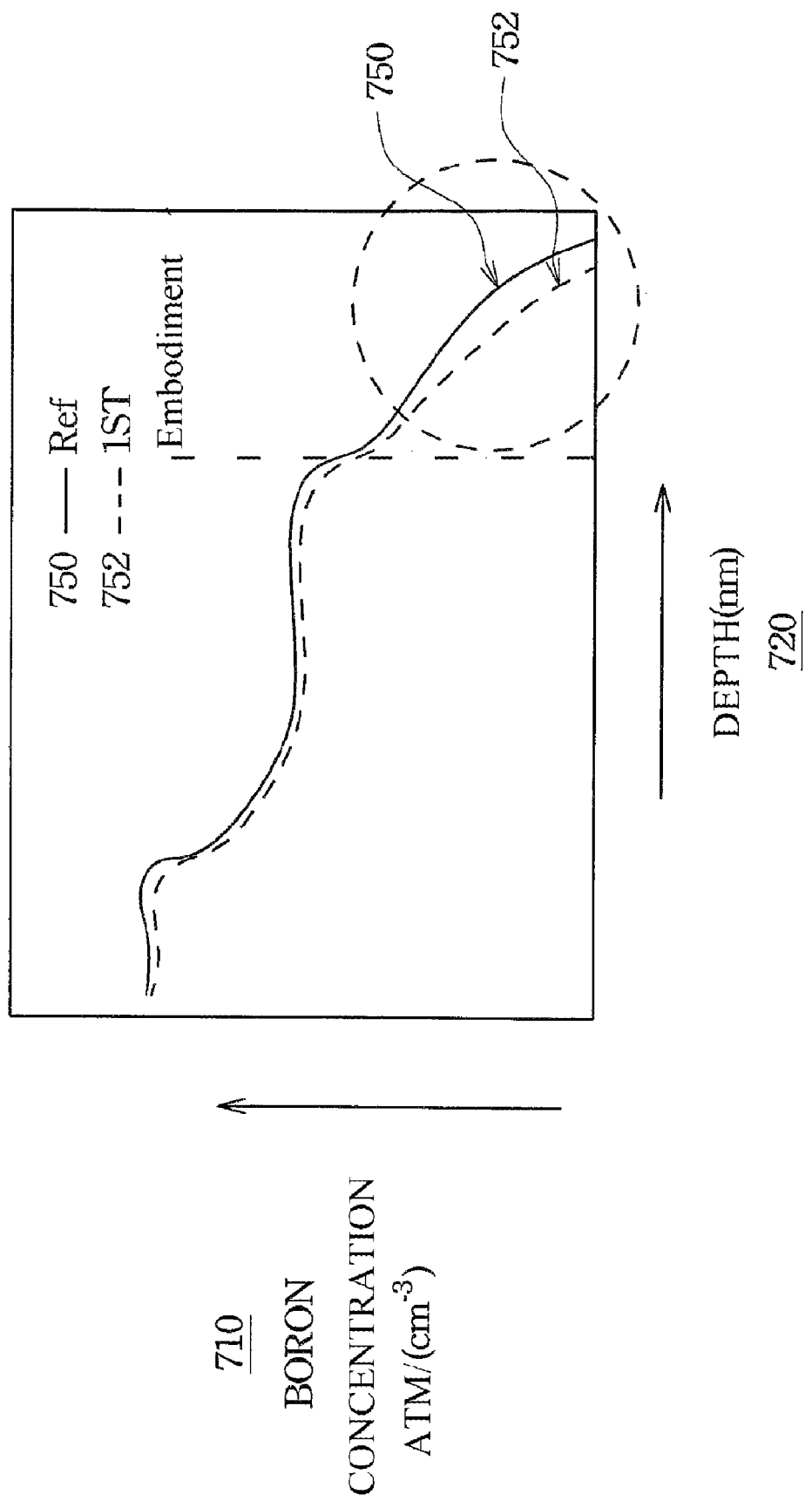
FIG. 7 depicts the boron concentration versus depth, according to an illustrated embodiment.

FIG. 7 shows the boron concentration versus depth. The y-axis 710 depicts the boron concentration in atoms cm$^{-3}$. The x-axis 720 depicts the depth of the sample. As the sample depth increases, the boron dopant in the sample decreases. At the bottom interface of the boron doped SiGe stressor (indicated by the vertical dotted line), the concentration for the reference 750 (prior art sample) depicted by a solid line, and the first illustrative embodiment 752 depicted by a dashed line, is greater than 1E20 atm/cm$^3$. As the depth of the samples exceeds 60 nm, the curves diverge. For a given depth, the illustrative embodiment 752 indicates a lower boron concentration, which illustrates that boron out-diffusion has been retarded.

Figure 8:
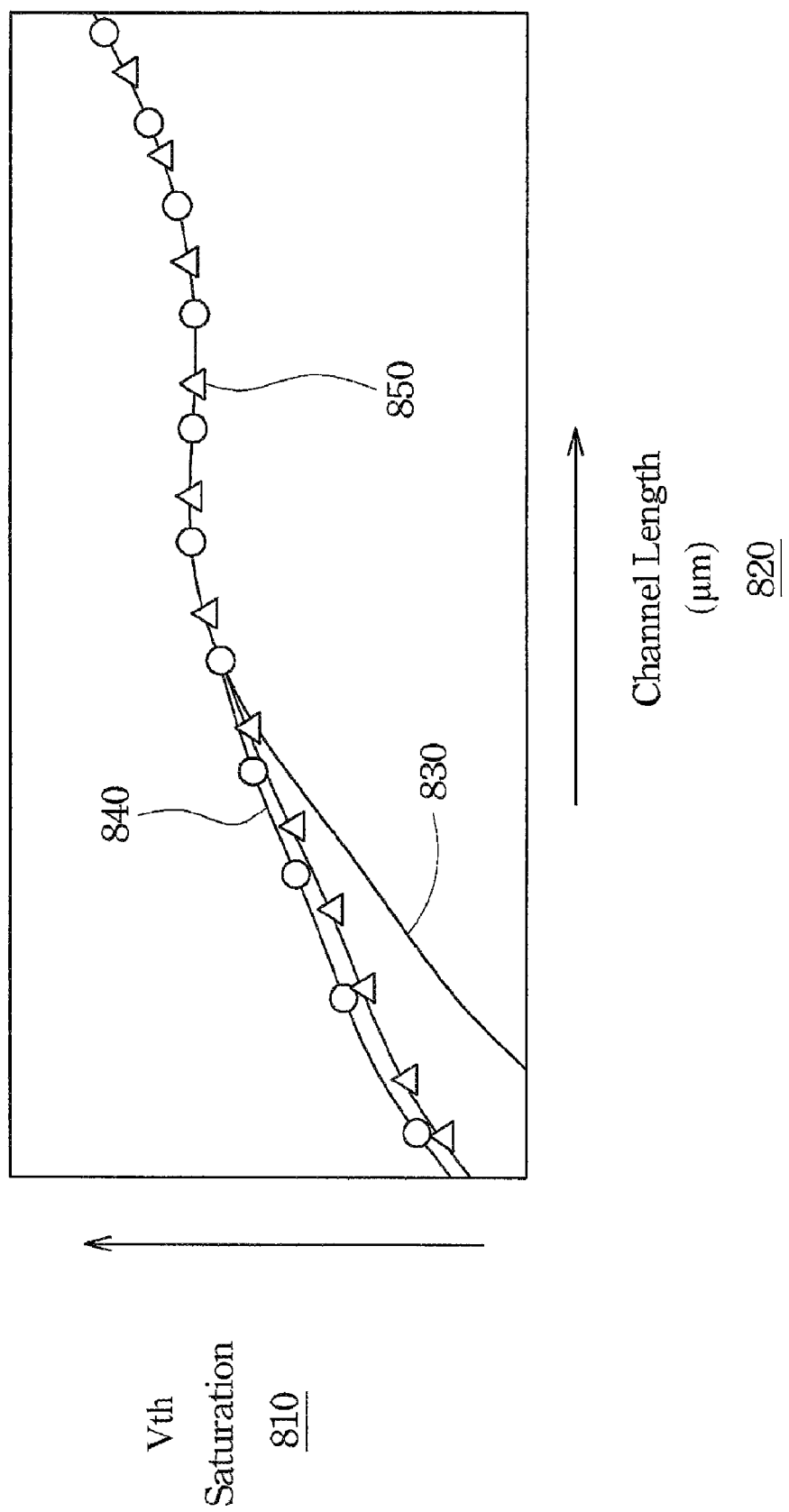
FIG. 8 is a graph of voltage threshold by channel length (Lmask), according to an illustrated embodiment.

FIG. 8 is a graph of voltage threshold (V) by channel length (μm). The y-axis 810 indicates the voltage threshold ($V_{th}$). The x-axis 820 is the linewidth in um of the short channel poly linewidth (mask parameter). The solid curve 830 is the reference curve, the open circles curve 840 illustrates the first embodiment, and the open triangle curve 850 illustrates the $V_{th}$ of the second embodiment. As can be seen, the aforementioned $V_{th}$ roll-off is more pronounced for the reference curve 830 than the first embodiment curve 840 (open circles) or the second embodiment 850 (open triangles).

Figure 9:
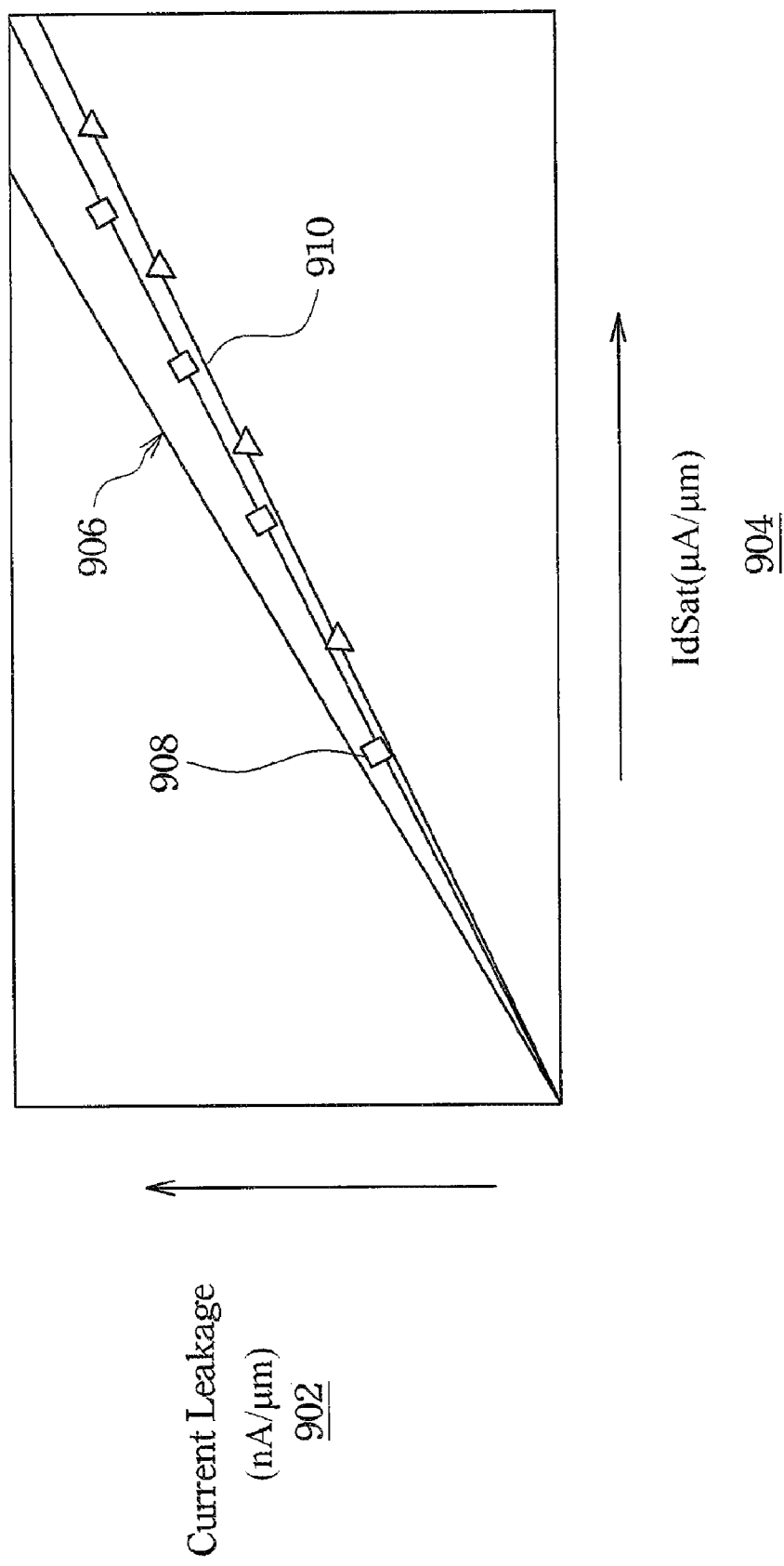
FIG. 9 is a graph of drive current saturation by leakage current, according to an illustrated embodiment.

A further advantage of the illustrative embodiments is shown in FIG. 9, a graph of drive current saturation (μA/μm) by leakage current (nA/μm). The y-axis 902 indicates the leakage current in μA/μms. The x-axis 904 indicates the drive current saturation in μA/μms. As can be noted in the figure, the reference sample 906, indicated by the solid line, shows greater leakage currents at the same drive current saturation as illustrative embodiments of the present invention, the first embodiment 908 (open squares) and the second embodiment 910 (open triangles). The lower leakage currents of the illustrative embodiments may translate to higher device yields.

A feature of the illustrative embodiments is to retard sidewall dopant (boron) out-diffusion from a stressor, in this example, a e-SiGe stressor, by implanting a barrier dopant, in this example a carbon implant. RTA anneal may follow the carbon implant to allow for a reduced defect interface following the e-SiGe deposition and incorporating Nitrogen into SiGe recess interface. This invention may effectively reduce drain induced barrier lowering (DIBL) by 30% and improve drive current saturation (IdSAT) more than 5% with proper pocket dopant reduction. Additionally, the reduction of pocket dose is expected to help relieve an SRAM $V_{th}$ mismatch issue, which may be due to asymmetric pocket distribution.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a gate structure on a semiconductor substrate; and
   a source region and a drain region in recesses within the semiconductor substrate on opposing sides of the gate structure;
   wherein each of the source region and the drain region comprises a doped stressor embedded in recesses formed completely within the semiconductor substrate and a dopant containing portion formed completely lining the recesses and between the doped stressor and the semiconductor substrate, and the dopant-containing portion comprises nitrogen.

2. The semiconductor device of claim 1, wherein a nitrogen concentration in the dopant-containing portion is greater than 5 E18 atoms/cm$^{-3}$.

3. The semiconductor device of claim 1, wherein the dopant-containing portion substantially lines the doped stressor.

4. The semiconductor device of claim 1, wherein the doped stressor is selected from a group consisting of SiGe doped with boron, and Si doped with antimony.

5. The semiconductor device of claim 1, wherein the doped stressor comprises epitaxial Si—Ge.

6. The semiconductor device of claim 1, wherein the dopant-containing portion comprises carbon.

7. The semiconductor device of claim 1, wherein of the dopant-containing portion comprises fluorine.

8. A semiconductor device comprising:
a gate structure on a semiconductor substrate; and
a source and a drain in recesses formed completely within the semiconductor substrate on opposing sides of the gate structure;
wherein each of the source region and the drain region comprises a boron-doped SiGe stressor embedded in the recesses in the semiconductor substrate and a dopant containing portion formed completely lining the recesses and between the boron-doped SiGe and the semiconductor substrate, and the dopant-containing portion comprises carbon.

9. The semiconductor device of claim 8, further comprising a nitrogen concentration in the dopant-containing portion is greater than 5 E 18 atoms/cm$^{-3}$.

10. The semiconductor device of claim 8, wherein the dopant-containing portion substantially lines the boron-doped SiGe stressor.

* * * * *